United States Patent [19]

Goldberg

[11] Patent Number: 4,683,588

[45] Date of Patent: Jul. 28, 1987

[54] FASE MASK WITH VOICE MODIFYING CAPABILITY

[76] Inventor: Mel Goldberg, c/o Topstone Industries, Inc., 2 Augusta Dr., Danbury, Conn. 06810

[21] Appl. No.: 788,349

[22] Filed: Oct. 17, 1985

[51] Int. Cl.[4] .............................................. H03G 3/00

[52] U.S. Cl. ..................................... 381/61; 379/430; 2/410

[58] Field of Search ...................... 179/156 R; 446/27; 2/410, 5, 6, 417, 421, 422, 424; 381/157, 158; 379/433, 437, 430

[56] References Cited

U.S. PATENT DOCUMENTS 4,400,591 8/1983 Jennings et al. ................ 179/156 R

*Primary Examiner*—Forester W. Isen

*Attorney, Agent, or Firm*—Schweitzer & Cornman

[57] ABSTRACT

An over-the-head face mask is provided with a self-contained microphone, a voice signal modifying device and a speaker for providing a costumed appearance for the individual wearer of the face mask and, in addition, a camouflaging or novelty effect on the wearer's voice. A microphone secured to the face mask is located proximal to the mouth of the wearer and is electrically connected to a voice signal modifier which, in turn, is connected to a speaker. The electrical components are powered by self-contained batteries located within a space provided between the hood portion of the face mask and a fabric liner. The voice signal modifier can amplify or muffle the wearer's voice, shift the frequency of the wearer's voice, produce a monotone voice effect or any other desired camouflaging effect to the wearer's voice. In addition, the face mask can be provided with light bulbs for the fake eyes of the mask. An on/off toggle switch can be electrically connected to the electrical components to switch on or off, as desired, the voice modifying aspects of the present invention. The voice signal modifier can be selectively removed and replaced by a different voice signal modifier in a quick and simple manner. The microphone, voice signal modifier and speaker can be located in a protrusion of the mask, an integral disguise feature of the mask.

7 Claims, 3 Drawing Figures

FASE MASK WITH VOICE MODIFYING CAPABILITY

BACKGROUND OF THE INVENTION

The present invention is a novelty item, in the form of an over-the-head face mask having the capability of modifying the individual wearer's voice to produce a highly desired novelty effect. All of the electrical components required to modify the wearer's voice are self-contained within the face mask. The face mask, itself, produces a desired novelty or camouflaging effect and hides, disguises, camouflages, etc. the wearer's face while the voice modifier camouflages, disguises, etc. the wearer's voice and, yet, allows the wearer to communicate while preserving the secret identity of the wearing individual.

Face masks, including full over-the-head face masks are used by children and adults to produce desired novelty effects. They are particularly used during Halloween parties, masquerade parties and, also, for play-acting by children. Adults have been known to don face masks to produce a comedic or shocking response at a party or simple get-together. In any event, however, an over-the-head face mask camouflages and disguises the actual identity of the wearer and that is a desired function of such a mask. However, when the wearer of the face mask either without prodding or in response to a question speaks, those observers personally familiar with the wearer will generally be able to deduce the identity of the wearer by his or her particular voice. This, obviously, negatively impacts on a desired novelty effect of face masks to diguise and camouflage the identity of the wearer. Therefore, it is an object of the present invention to produce an over-the-head face mask which allows the wearer to speak and, yet, the voice spoken by the wearer is modified, electrically, so that the voice is camouflaged or disguised. Clearly, this is a desired result and contributes significantly to the desired novelty effect of a face mask.

Therefore, it is an object of the present invention to produce a self-contained, inexpensive, over-the-head face mask which camouflages both the wearer's face and, in addition, the wearer's voice. In addition, it is an object of the present invention to produce a voice signal modifying device in conjunction with a novelty face mask, the components of which are self-contained so that no additional accessories or equipment are required to produce the desired effect.

As mentioned, face masks are worn by adults and children for a variety of reasons. Without question, however, part of the fun of wearing a novelty face mask is often in the effect it has on the viewers of the mask, their expression of surprise, shock, horror, etc. and, also, in the wearer's knowledge that the observer does not known the identity of the individual who is wearing the mask. Therefore, when the wearer of an ordinary face mask is forced, absent the present invention, to speak or respond to an inquiry by an observer, the observer can frequently detect and discern the identity of the person wearing the face mask if his or her voice is familiar to the observer which, therefore, eliminates part of the "fun" of wearing the mask itself. That is to say, once the wearer's identity is revealed, part of the novelty effect of the face mask is lost. The present invention provides for an over-the-head face mask which disguises and camouflages the wearer's face and, yet, the wearer can speak or respond to inquiries and his or her voice is modified so that the observer can still not discern or detect the true identity of the wearer. Clearly, this is a desired object and certainly provides an interesting novelty item.

DESCRIPTION OF THE PRIOR ART

Over-the-head face masks, novelty masks, or disguise masks are well-known in the art. They take a variety of forms including comical expressions, famous personalities, horrible faces, cartoon characters, alien beings, etc. All of these masks provide a camouflaging or disguising effect to the wearer's face but do not disguise the wearer's own voice. As previously mentioned, it is a highly desired object of the present invention to allow the wearer to speak while still camouflaging and masking the wearer's voice and, therefore, his or her identity.

One over-the-head face mask known to Applicant provides a speaker, power source in the form of batteries and associated integrated circuitry, all electrically connected and secured in a plastic molded breastplate hanging down from the neck portion of the face mask and intended to be worn beneath the wearer's clothing. An on/off switch can also be located in the plastic breastplate. This device while constituting a face mask making noise, a desired novelty effect, however, does so by providing a predetermined sequence of noise, in the form of musical tones, and, therefore, does not allow the wearer the freedon of speaking in a camouflaged manner. Rather, the prior art device merely provides a series of preprogrammed noises emanating from the face mask. Clearly, the present invention is a significant advance over this prior art device, in that it is now possible, with the present invention, for the wearer to speak or respond to others inquiries directed to him and, yet, his responses are camouflaged and his or her identity maintained in secrecy.

A second form of an over-the-head face mask with a noise generating capability is fully described in my co-pending patent application entitled NOISE MAKING MASK, U.S. Ser. No. 784,360, filed Oct. 3, 1985. In that application, it is fully disclosed that an electrical speaker, connected to an integrated circuit, a power source in the form of batteries and an on/off switch, can be secured within a protuberance of the face mask, integrally molded therewith, which protuberance constitutes an integral design portion of the face mask and positively locates the speaker proximal to the wearer's mouth area. The noise making face mask of my filed and copending application, identified above, as well as the face mask with the plastic breastplate serving to hold the electrical components do not allow the wearer the freedom to speak whatever he or she wants while still preserving the secrecy of their true identity. The present invention, however, is directed to an over-the-head face mask which allows the wearer to freely speak and, yet, the wearer's voice is camouflaged and disguised by a voice signal modifying device that is electrically interconnected between the microphone, located near the wearer's mouth and a speaker. According to the preferred embodiment of the present invention, the speaker is also located proximal to the mouth area of the over-the-head face mask.

SUMMARY OF THE INVENTION

The present invention relates to an over-the-head face mask having a self-contained voice disguising device. The face mask is provided with electrical components capable of modifying the wearer's voice to disguise and camouflage it. More specifically, a rubber, latex or plastic molded face mask, adapted to be worn over an individual's head, is slipped over the wearer's head and maintained thereon by either an elastic band or, preferably, a rear hood portion of the face mask is secured to the front face disguising section to provide a complete over-the-head mask. The face mask, in a well-known manner, is provided with disguise features to present a face either comedic, horrible, a face of a well-known personality, an animal, an alien being, etc. In the preferred embodiment of the present invention, however, illustrated in FIG. 1 hereof, an alien being from another planet is envisioned having a strange protruding furrowed eyebrow area and a non-human mouth area. Contributing to the disguise and, yet, realistic human-like representation of the face mask, fake hair is often provided and rooted in the hood portion attached to the disguise section of the face mask.

According to the present invention, the face mask is provided with an electrical wearer's voice modifying capability; all of the electrical components being self-contained within the over-the-head face mask. A microphone, electrically capturing the wearer's voice is located, in the preferred embodiment, immediately proximal to the wearer's mouth. The microphone is electrically connected to a voice signal modifying device which serves to alter the electrical signals transmitted by the microphone so that they, when connected to a speaker provides speech in a distorted manner from the wearer's actual voice if not affected by the device. According to the present invention, the voice signal modifying device can do any one or more of the following to the wearer's actual voice, namely, amplify in volume, muffle in volume, shift in frequency, mask high or low frequencies produce a monotone, computer-like voice from the wearer, etc. Any one or more of those functions can be used in the present invention, as well as others, as long as the voice of the wearer is modified or altered to thereby camouflage or disguise the face mask wearer's voice. In this manner, the identity of the wearer is maintained in secret or, at the very least, a new novelty effect is achieved.

The microphone, voice signal modifying device and speaker are electrically connected, along with a power source in the preferred form of batteries and an on/off switch. Also, according to the preferred embodiment of the present invention, the batteries and on/off switch, as well as a portion of the wires interconnecting the electrical components are housed between the space provided by the inside of the hood portion of the face mask and a fabric liner of the hood. The fabric liner serves to protect the wearer's face from contact with the electrical wires and electrical components. Also, according to the preferred embodiment of the present invention, light bulbs or light emitting diodes are provided as the pupils of fake eyes of the disguise portion of the face mask which, too, are electrically connected to the batteries or power means and the on/off switch, so that they will flash or, alternatively, be in a constant "on" position whenever the voice signal modifying device is switched "on".

The microphone and voice signal modifying device, as well as the speaker, are preferably housed within an integrally molded protuberance of the present invention and maintained in position by an annular rim. In this manner, the electrical components and, specifically, the microphone, the voice signal modifying device and the speaker can, individually, or collectively, be removed and replaced, as desired.

It is also contemplated by the present invention that a first voice signal modifying device be selectively removed, along with the microphone and replaced by a second different voice signal modifying device and microphone, to produce a novelty over-the-head face mask having a variety of voice modifying functions. For example, a first voice signal modifying device having the ability to distort the wearer's voice can be removed and replaced by a second voice signal modifying device capable of blocking out high frequencies. This provides a highly versatile novelty, over-the-head mask. It is contemplated that simple mechanical and electrical male and female connectors can be used for accomplishing the ease of interchangeability of the voice signal modifying devices, with or without a microphone.

DETAILED DESCRIPTION OF THE DRAWINGS AND THE PREFERRED EMBODIMENT

Figure 1:
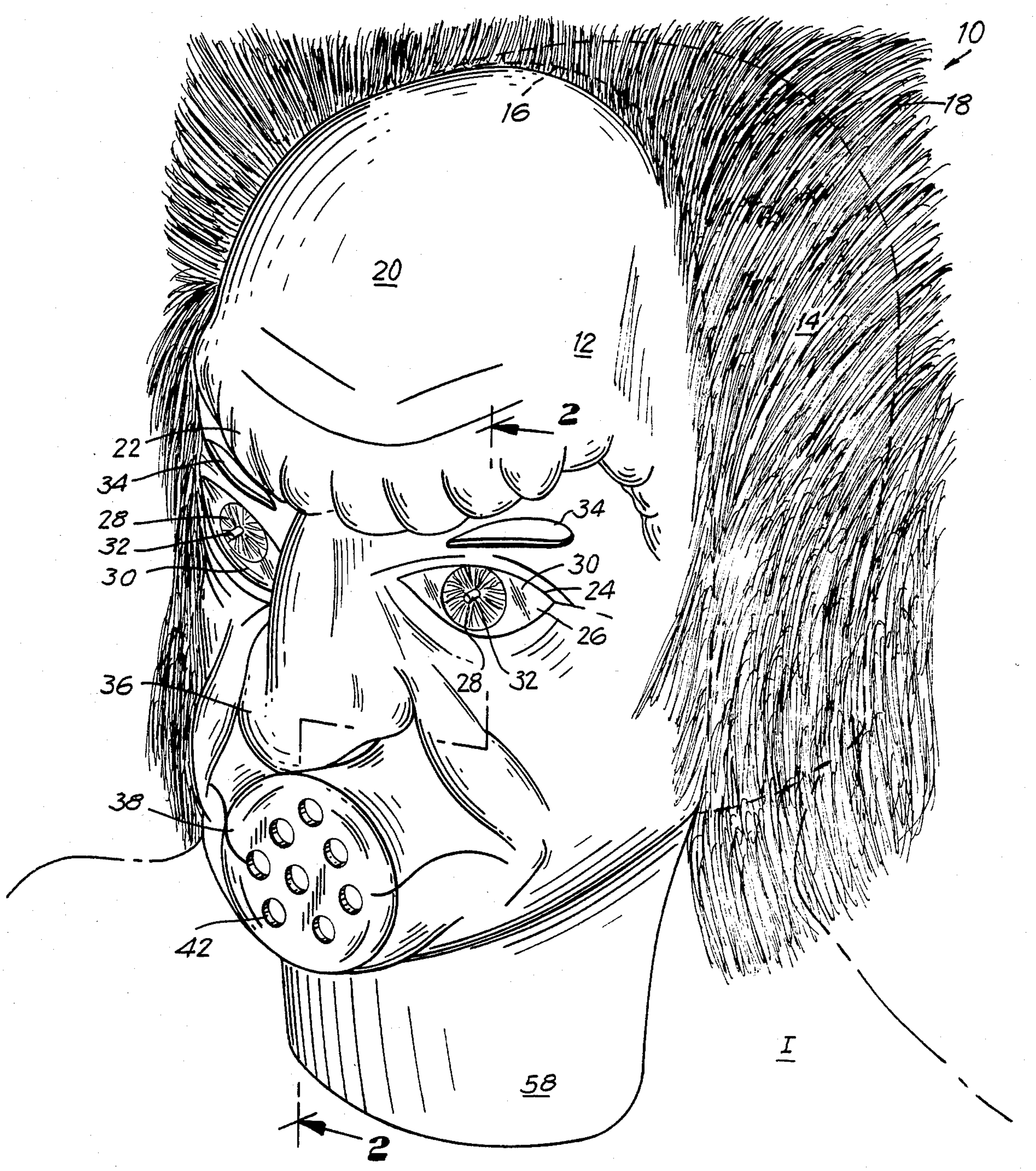
FIG. 1 is a perspective view of the face mask of the present invention, with the hood portion shown in phantom lines.
Figure 2:
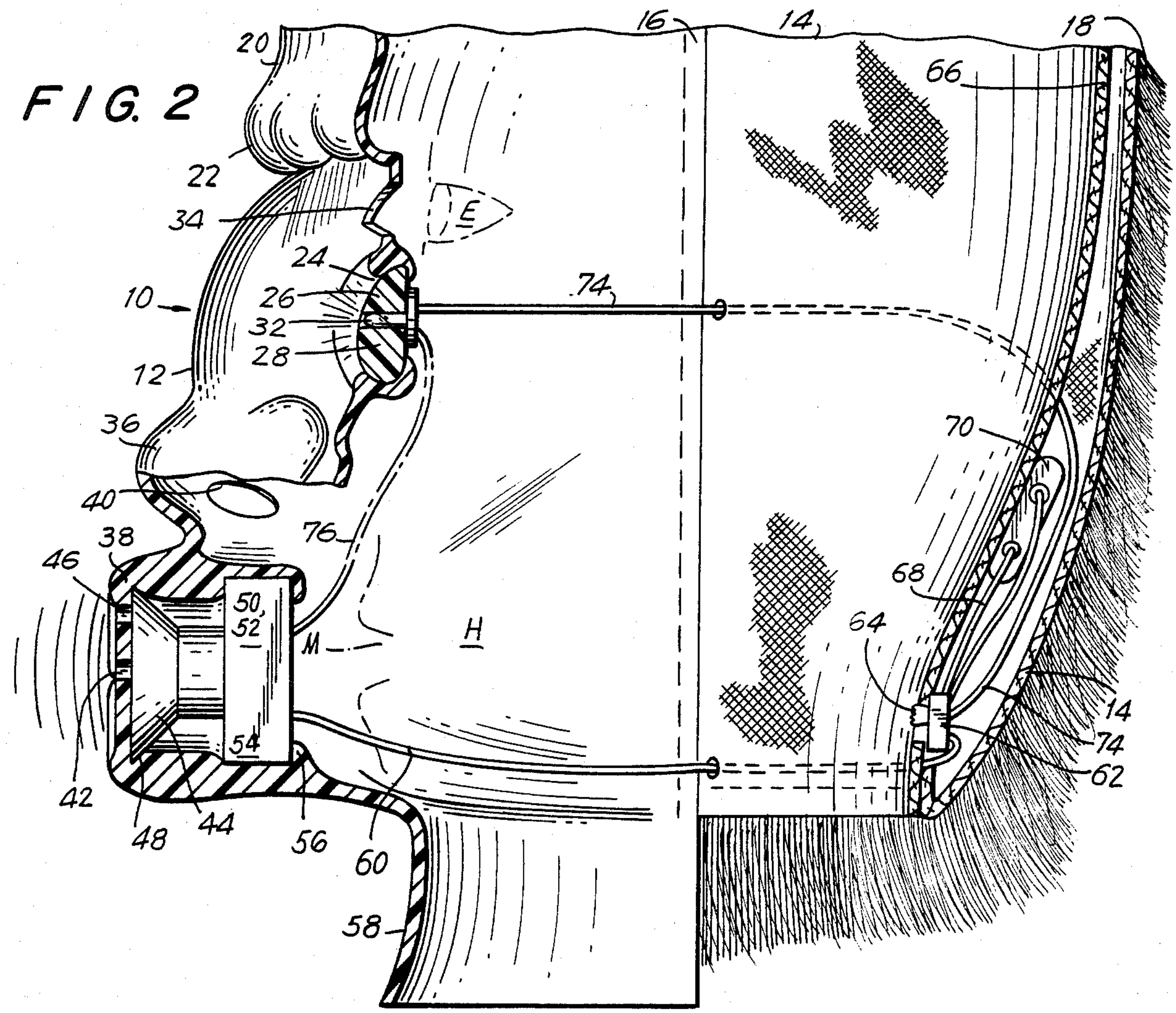
FIG. 2 is a partial cross sectional view of the face mask of the present invention, taken along lines 2—2 of FIG. 1 and also showing the face mask in position as intended to be worn by an individual.
Figure 3:
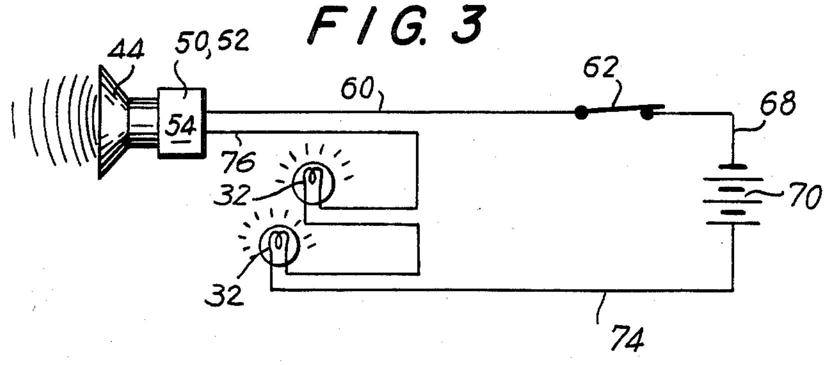
FIG. 3 is a simple proposed electrical schematic of the electrical circuitry, showing the components and connecting wiring, of the present invention.

As best seen in FIGS. 1 and 2, an over-the-head face mask 10 is sized so as to properly fit over the head H of the wearing individual I. In this connection, it should be appreciated that the face mask 10 of the present invention can be a "one size fits all" model or, alternatively, different sized face masks can be provided for a line of children and adult masks. The face mask 10 comprises a face-covering disguise section 12, preferably made from latex, rubber or plastic molded material. The rear of the face mask 10 comprises a hood portion 14 which is sewn to the disguise section 12 as at seam 16. In an alternate embodiment of the present invention, the disguise section 12 and the rear hood portion 14 can be integrally molded as a single piece of rubber, plastic or latex, etc. material. Also, in an alternate embodiment of the present invention, the face mask can simply comprise the front disguise section 12, with the mask being maintained on the individual's head H by an elastic strap or some other holding mechanism. However, it should be appreciated that the preferred embodiment of the present invention is that shown in FIGS. 1 and 2. Hood portion 14 can be provided with fake rooted hair 18 to color disguise the hair of the wearer and to provide a more realistic, i.e., human appearance for the face mask, if desired.

Disguise section 12 has a plurality of sections which basically correspond to a human face. For example, a forehead section 20 is located at the top of disguise section 12, with a furrowed eyebrow area 22 located below the forehead section 20. In the illustrated mask of FIGS. 1 and 2, the furrowed eyebrow area 22 separates the forehead section 20 from the lower sections of the face mask. Of course, it should be appreciated that the disguise section 12 can take a variety of artistic, fanciful or design configurations and, therefore, it is quite conceivable that no forehead area or furrowed eyebrow area is actually provided. However, again, the preferred and illustrated embodiment of the present invention shows the forehead section 20 with an overhanging furrowed eyebrow area 22. Located below the furrowed eyebrow area 22 is a pair of fake eye sockets 24 which receptively receive plastic or glass oval shaped fake eyes 26. The precise manner of mounting fake eyes 26 into fake eye sockets 24 is described in my copending patent application entitled MASK WITH REALISTIC EYES AND METHOD FOR MANUFACTURING SAME, Ser. No. 738,073, filed May 24, 1985. Preferably, the fake eyes 26 are plastic and provided with a solid color central portion to provide realistic-looking irises 28 and realistic-looking white areas 30. Located centrally in each of the fake irises 28 of the fake eyes 26 is a light-emitting diode or red light bulb 32 to provide the equivalent of the pupils of the fake eyes 26. It should also be appreciated that a pair of actual eye slots or apertures 34 are provided immediately above the fake eye sockets 24 and below furrowed eyebrow area 22, so that the individual's eyes E (see FIG. 2) can actually see through the eye slots 34. In this connection, the overhanging or protruding furrowed eyebrow area 22 provides a camouflaging or disguising effect for the actual eye slots 34 and the individual's real eyes E looking therethrough and, therefore, to a casual observer, it appears that the fake eyes 26 are, in fact, the "seeing" eyes of the individual I since the individual's eyes E are, at least partially, covered by furrowed eyebrow area 22. The face covering disguise section 12 is further provided with a nose 36, and a mouth area 38. Nose 36 of the face mask 10 is provided with nostril apertures 40 so that the wearer can easily breathe through his or her nose. The mouth area 38, in the preferred embodiment of the present invention, comprises an outwardly extending protuberance integrally molded with the disguise section 12 and located beneath the nose 36.

In the embodiment shown in FIGS. 1 and 2, the mouth area 38 comprises a protuberance which has speaker apertures or holes 42 passing through the rubber material of the mask. These speaker apertures 42 allow the noise generated by the speaker to pass clearly through the mask without being further muffled or modified by the mask material itself. In addition, it is conceivable that the speaker apertures are not fully covered by the front face of the speaker 44 and, therefore the speaker apertures provide air and ventilation to the individual's mouth M. The mouth area 38 is generally frusto-conical and has an inside circular front face 46 against which the front portion of speaker 44 positively is maintained. In a preferred embodiment of the present invention, the diameter of the front of speaker 44 is slightly larger than the diameter of front face 46 of mouth area 38, so that when the speaker 44 is inserted into the rubber or plastic mouth area 38, it is first necessary for that area to be slightly stretched to accommodate the larger size of speaker 44 with the rubber-like material of the mouth area 38 then contracting around the front face 46 of the speaker 44 to hold it in place, i.e., after initial placement, the elasticity of the material of the mouth area 38 positively maintains the speaker in a flush to front face 46 position. In addition, the front face 46 of mouth area 38 can have a slight undercut 48 to accommodate and maintain speaker 44 in relative position.

Located behind speaker 44 is a combination microphone 50 and voice signal modifying device 52. In the preferred embodiment of the present invention, microphone 50 and voice signal modifying device 52 are a single electrical combination unit 54. However, it should be appreciated that the electrical components, microphone 50 and voice signal modifying device 52, can be separate, with the microphone being located nearer to the individual's mouth M.

Electrical combination unit 54 is mechanically and electrically connected to speaker 44 by any standard or conventional means and, by way of example, by male and female corresponding plug and receptacle means (not shown). Electrical combination unit 54 is located within protuberance or mouth area 38 and is held in relative position by annular rim 56. To assemble the face mask of the present invention, speaker 44 is first pushed into the mouth area 38, annular rim 56 is then bypassed by the rear of electrical combination unit 54 until the front face of the speaker 44 is flush against the front face 46 of mouth area 38. The annular rim 56 then serves to positively "hold" the electrical unit 54 in position. A neck section 58 is also integrally molded with the disguise section 12.

In the embodiment shown in FIGS. 1 and 2, the mouth area 38 is integrally molded into the disguise section 12 and constitutes an integral disguise aspect of the overall appearance provided by disguise section 12. It should be appreciated, however, that the speaker 44 can be located in another portion of the face mask, as long as it is proximal to the disguise section 12. However, it is considered highly desirable for the microphone 50 to be proximally located to the mouth M of the individual I.

Hard electrical wire 60 connects electrical combination unit 54 to on/off toggle switch 62. Hard wire 60 passes around one side of the individual's head H and is connected to the on/off toggle switch 62 in a conventional manner. The slide-switch 64 of on/off toggle switch 62 pokes or projects through a fabric liner 66 of the hood portion 14 of face mask 10. In this manner, the individual I, when he or she desires to activate the voice signal modifying device of the present invention, can simply reach behind his or her head H and slide the slide-switch 64 from the "off" or first position to the "on" or second position or, vice versa, if it is desired to turn off the voice modifying apparatus. The fabric liner mechanically and electrically protects the individual I from the various electrical components. Wire 68 connects on/off toggle switch 62 to the power supply means or battery pack 70 which, in the preferred embodiment, constitutes two "A" size batteries. Wire 74 connects power supply means or battery 70, in series, to the light-emitting diodes or red light bulbs 32 of fake eyes 26. Wire 76 connects one of the light-emitting diodes or red light bulbs 32 of fake eyes 26, again, in series, to electrical combination unit 54. It should be appeciated that electrical power supply means or battery pack 70 and the on/off toggle switch 62, as well as much of the wires interconnecting the electrical components are located in the space defined by the inside of the hood portion 14 and the fabric liner 66.

With face mask 10 worn on an individual's head H, the individual can simply reach behind his or her neck and push slide switch 64 of the on/off toggle switch 62 from an "off" position to an "on" position. When that is done, the light-emitting diodes or red light bulbs 32 will be constantly lit or, alternatively, it is possible that they are adapted to "flash" on and off, respectively. In addition, switching the on/off toggle switch 62 from the "off" position to the "on" position activates the microphone 50, voice signal modifying device 52 and the speaker 44, so that the voice of the individual will be modified and distorted, as desired, to enhance the camouflaging or disguising aspect of the face mask 10. The nature of the distortion or modification of the wearer's voice is directly dependent upon the voice signal modifying device actually used. In the preferred embodiment of the present invention, the voice signal modifying device 52 can be any one or more of a voice volume amplifier, a voice volume muffler, a frequency shifter, a frequency range masking device or a voice monotone generator. In any event, and even if the voice signal modifying device comprises a combination of those functions, the sound actually emitted by speaker 44 is altered or somewhat modified from the actual voice spoken by the face mask wearer, to thereby provide a further disguising or camouflaging aspect of the face mask.

It is also within the scope of the present invention that electrical combination unit 54 comprising, in the preferred embodiment, microphone 50 and voice signal modifying device 52, can be selectively removed and replaced by a different electrical combination unit 54, having a new microphone 50 and a second voice signal modifying device having a different modifying or distorting function from the first used voice signal modifying device. For example, a first electrical combination unit 54 can provide a voice frequency shifting to the actual voice of the wearer, which provides a first desired novelty, camouflaging or disguising effect. If, however, the wearer desires to change the modifying effect of the voice signal modifying device 52, the face mask 10 is first removed from the wearer's head H, electrical combination unit 54 is unplugged, both electrically and mechanically from speaker 44, and replaced with a new electrical combination unit 54. The second electrical combination unit 54 can, for example, provide a volume amplifier to thereby produce a second and different modification of the actual voice of the individual I and, thus, a second desired novelty effect is achieved.

It should be understood, of course, that the specific form of the invention herein illustrated and described is intended to be representative only, as certain changes may be made therein without departing from the clear teachings of the disclosure. Accordingly, reference should be made to the following appended claims in determining the full scope of the invention.

I claim:

1. A face mask comprising:

(a) a face covering disguise section having a mouth area in the form of a forwardly projecting protrusion, said protrusion having a retention rim, integrally molded with said disguise section;

(b) a speaker proximally secured within said protrusion;

(c) a microphone proximally secured to said mouth area;

(d) voice signal modification means electrically connected between said microphone and said speaker and also located within said protrusion, said retention rim serving to firmly abut against said voice signal modification means to hold the same in place yet being resilient enough to allow for repeated and easy removal and replacement of said voice signal modification means within said protrusion;

(e) electrical power means for electrically connecting and driving said microphone, said voice signal modification means and said speaker; and (f) said voice signal modification means being modularly connected to said speaker and being capable of easy disconnection from and replacement by a second voice signal modification means.

2. A face mask as claimed in claim 1, wherein:

(a) said voice signal modification means is a volume amplifier.

3. A face mask as claimed in claim 1, wherein:

(a) said voice signal modification means is a muffler.

4. A face mask as claimed in claim 1, wherein:

(a) said voice signal modification means is a distorter.

5. A face mask as claimed in claim 1, wherein:

(a) said voice signal modification means produces speech at a monotone.

6. A face mask as claimed in claim 1, wherein:

(a) said voice signal modification means is a frequency shifter.

7. A face mask as claimed in claim 1, wherein:

(a) said voice signal modification means is a selective frequency blocker.

* * * * *